United States Patent
Ball

(10) Patent No.: US 8,990,474 B2
(45) Date of Patent: Mar. 24, 2015

(54) LOGIC DEVICE HAVING A COMPRESSED CONFIGURATION IMAGE STORED ON AN INTERNAL READ ONLY MEMORY

(75) Inventor: James L. Ball, Scotts Valley, CA (US)

(73) Assignee: Altera Corporation, San Jose, CA (US)

( * ) Notice: Subject to any disclaimer, the term of this patent is extended or adjusted under 35 U.S.C. 154(b) by 564 days.

(21) Appl. No.: 13/310,574

(22) Filed: Dec. 2, 2011

(65) Prior Publication Data

US 2013/0145074 A1    Jun. 6, 2013

(51) Int. Cl.
*G06F 13/00* (2006.01)
*H03K 19/177* (2006.01)

(52) U.S. Cl.
CPC .................................. *H03K 19/1776* (2013.01)
USPC .................... 711/102; 711/170; 711/E12.084

(58) Field of Classification Search
None
See application file for complete search history.

(56) References Cited

U.S. PATENT DOCUMENTS

| | | |
|---|---|---|
| 6,028,445 A | 2/2000 | Lawman |
| 6,097,988 A | 8/2000 | Tobias |
| 6,327,634 B1 | 12/2001 | Statovici |
| 6,563,437 B1 * | 5/2003 | Landry et al. .................... 341/51 |
| 7,558,995 B1 * | 7/2009 | Simmons et al. ............. 714/724 |
| 8,069,329 B1 | 11/2011 | Tang et al. |
| 2004/0045030 A1 * | 3/2004 | Reynolds et al. ............. 725/110 |
| 2005/0102573 A1 | 5/2005 | Sun et al. |
| 2008/0157813 A1 * | 7/2008 | Xia et al. ......................... 326/41 |
| 2008/0183968 A1 * | 7/2008 | Huang ......................... 711/125 |
| 2009/0256589 A1 * | 10/2009 | Nakagawa et al. ............. 326/38 |
| 2012/0084580 A1 * | 4/2012 | Harchol-Balter et al. .... 713/310 |

OTHER PUBLICATIONS

Extended European Search Report dated Jul. 22, 2014 issued in EP Application No. 12194840.0.

* cited by examiner

*Primary Examiner* — Sean D Rossiter
(74) *Attorney, Agent, or Firm* — Weaver Austin Villeneuve & Sampson LLP

(57) ABSTRACT

Systems and methods for using an internal read only memory (ROM) to configure a logic device are described. The ROM and the logic device may be located on a single chip. The ROM may be adapted to store highly compressed configuration images and be non-reprogrammable. The logic device may be configured based on the compressed configuration image.

18 Claims, 6 Drawing Sheets

US 8,990,474 B2

LOGIC DEVICE HAVING A COMPRESSED CONFIGURATION IMAGE STORED ON AN INTERNAL READ ONLY MEMORY

FIELD OF THE INVENTION

The present disclosure relates generally to a logic device of an integrated circuit (IC), and, more particularly, to storing, on an internal read only memory of the IC, a compressed configuration image for the logic device.

BACKGROUND

Logic devices such as a programmable logic device (PLD) or a field programmable gate array (FPGA) may be implemented on an integrated circuit (IC, or "chip"). The chip has a set of pins that are used to communicate, for example, data and control information to other chips. The logic device, upon power-on, may require to be configured by way of a "configuration image" that, conventionally, is stored in a flash memory that may be internal or external to the logic device.

In some known devices, for example, the logic device has a control block (CB) that receives a configuration image from the external flash memory chip, and uses the information in the configuration image to configure the logic device, when the logic device is powered on. Typically, some of the set of pins are assigned to the CB as mode select pins and others are used for communication between the external flash memory chip and the CB. For example, in some known devices, the CB samples the value of the mode select pins to determine the source of the configuration image. Moreover, the CB receives configuration data from the external flash memory via others of the set of pins.

SUMMARY OF THE INVENTION

The present inventor has appreciated that a configuration image may advantageously be stored, in an internal, non-reprogrammable, read only memory (ROM) of an integrated circuit, or chip, that also includes a logic device such as a PLD or FPGA. One or more factory-provided configuration images may be stored in the non-reprogrammable ROM. Advantageously, the factory-provided configuration images stored in the internal ROM (unlike data stored in a flash memory device) are not modifiable after the chip is manufactured. A control block may be enabled and acquire a selected one of the configuration images, by way, for example, of mode select pins. In some implementations, the logic device may still receive configuration information from an external source, in addition to the internal ROM.

As a result of the teachings presented herein, overall system cost and power consumption of the chip may be substantially reduced. Moreover, the integrity of factory-provided configuration images may be protected while still preserving the option of some configuration information to be provided from an external (e.g., user-provided) source.

BRIEF DESCRIPTION OF THE DRAWINGS

The presently disclosed techniques may best be understood by reference to the following description taken in conjunction with the accompanying drawings, which illustrate various embodiments of the present systems and methods.

DETAILED DESCRIPTION

Figure 1:
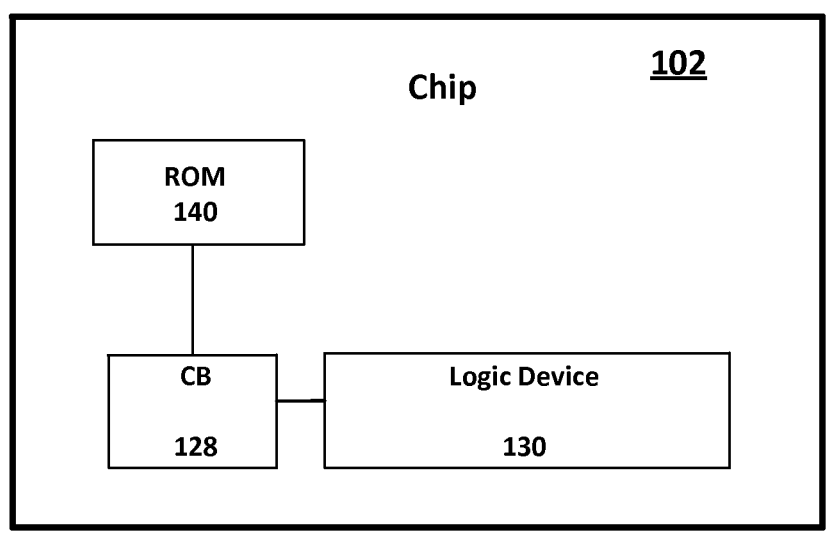
FIG. 1 is a block diagram of an embodiment of a system for configuring a logic device in accordance with one embodiment of the present invention.

Referring to FIG. 1, in an embodiment, chip 102 may include logic device 130, read only memory (ROM) 140 and control block (CB) 128. ROM 140 may be arranged so as to store one or more configuration images with which logic device 130 may be configured. According to one embodiment, the configuration images stored in ROM 140 may be in a compressed format. Control block 128 may be arranged to acquire configuration information from a selected one of the one or more compressed configuration images stored in ROM 140, and to use the acquired configuration information to configure logic device 130.

Figure 2A:
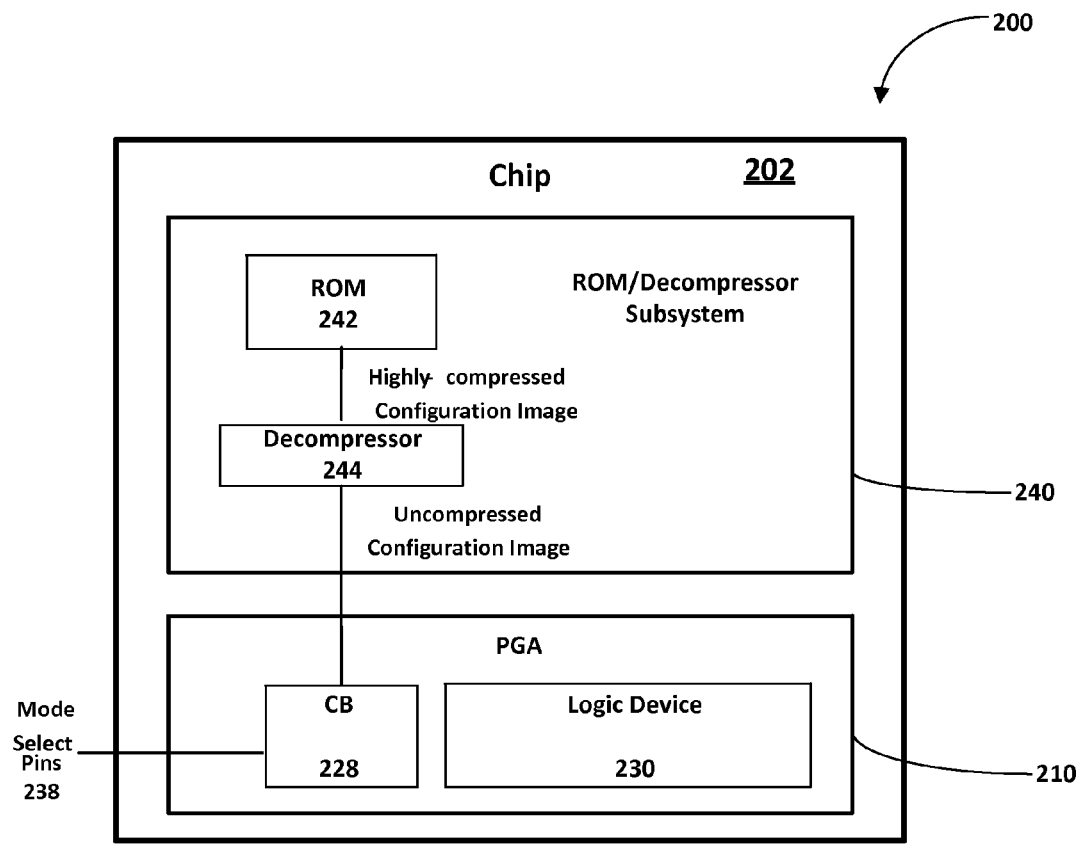
FIGS. 2A and 2B are block diagrams of an embodiment of a system in accordance with a further embodiment of the present invention.
Figure 2B:
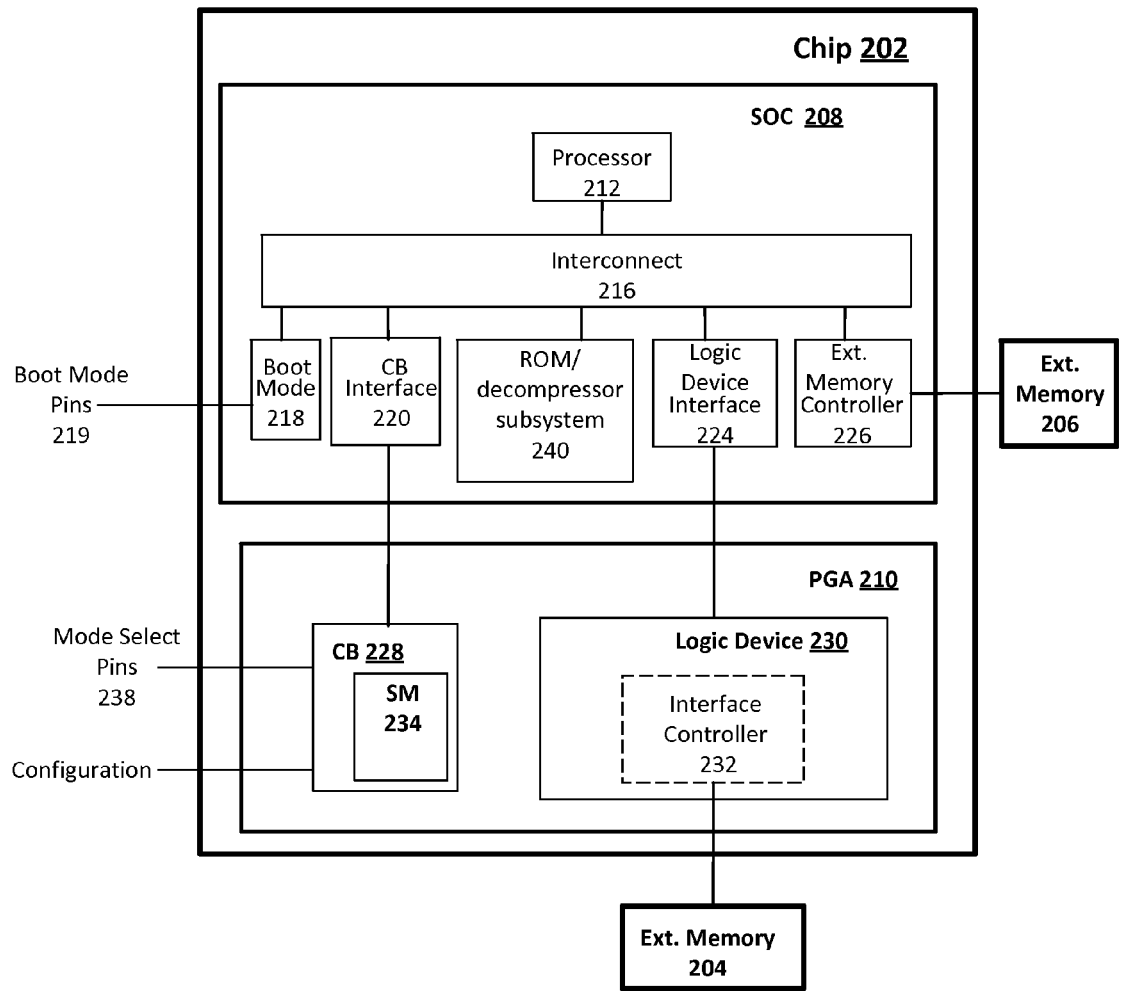

Referring to FIGS. 2A and 2B, details of certain implementations of the present teachings may be observed. In FIG. 2A, it is illustrated that a system 200 may include chip 202 and mode select pins 238. Chip 202 may include ROM/Decompressor subsystem 240 and programmable gate array (PGA) 210. ROM/Decompressor subsystem 240 may include ROM 242 and decompressor 244. PGA 210 may include control block 228 and logic device 230. Similar to the embodiment described in connection with FIG. 1, ROM 242 may store one or more compressed configuration images with which logic device 230 may be configured. Advantageously, a plurality of highly compressed configuration images may be stored on ROM 242. For example, each configuration image may be compressed by a factor of 50:1, 100:1, or higher. Logic device 230 may be a programmable logic device (PLD), for example. Control block 228 may be arranged to acquire, relative to a selected one of the one or more compressed configuration images, an uncompressed configuration image from decompressor 244. For example, mode select pins 238 may be arranged to cause control block 228 to select the selected one of the one or more compressed configuration images for decompression. Control block 228 may use the acquired uncompressed configuration image to configure logic device 230.

Referring now to FIG. 2B, a block diagram of system 200 is illustrated, in accordance with a further embodiment of the invention. System 200 may include chip 202, mode select pins 238 and external memories 204 and 206. Chip 202 may include a system on chip (SOC) 208 and a PGA 210. The PGA may be a field programmable gate array (FPGA). The SOC 208 may include a processor 212, a ROM/decompressor subsystem 240, an interconnect 216, a boot mode interface 218, a control block interface 220, a non-volatile memory 222, a logic device interface 224, and an external memory controller 226. Advantageously, ROM/decompressor subsystem 240 may be implemented in software on processor 212. For example, the decompression software may be stored in the ROM along with the one or more factory-provided compressed configuration images. In some embodiments, SOC 208 may include any number of external memory controllers, peripherals, random access memory (RAM), input/output (I/O) pins, and phased locked loops (PLL's). Moreover, PGA 210 may include control block 228 and logic device 230, which may include interface controller 232. In an embodiment, logic device 230 may further include a communication interface controller (not shown), logic elements (not shown), digital signal processing (DSP) blocks (not shown), RAMs (not shown), and/or routing interconnects (not shown). It is noted that the PGA 210 may include other components, such as, a PLL, a high speed serial interface (HSSI), and I/O pins. As noted above, logic device 230 may be a programmable logic device (PLD). The interface controller 232 may, for example, be a parallel NOR Flash memory controller, a serial NOR Flash memory controller, a NAND Flash memory controller, or a communications interface controller. In some embodiments, interface controller 232 may be a soft-logic memory controller that can be reconfigured by a customer of the manufacturer.

Interconnect 216 may couple processor 212 with ROM/decompressor subsystem 240, boot mode interface 218, control block interface 220, logic device interface 224, and external memory controller 226. Control block interface 220 may facilitate communication between the processor 212 and control block 228. Similarly, logic device interface 224 may facilitate communication between logic device 230 and processor 212. Moreover, the boot mode interface 218 may facilitate communication of a boot mode on a boot select pin 219 to the processor 212. The selection of the boot mode may be made by a user via a computer (not shown) coupled to the SOC 208 via a transceiver (not shown). More generally, software on SOC 208 may be configured to determine which factory ROM configuration image (if any) should be loaded into the PGA. The determination may be made, for example, based on an input to boot select pin 219 or communication with external logic via other pins of SOC 208. The transceiver may include an interface (not shown) that communicates with CB 228 using a protocol compatible with a configuration bus (not shown) and may include another interface that communicates with the computer via a link (not shown), such as a Joint Action Test Group (JTAG) link. Boot mode interface 218, control block interface 220, and logic device interface 224 may be implemented using one or more logic elements such as, for example, buffers. ROM/decompressor subsystem 240 may include non-reprogrammable ROM 242. In some embodiments, for example, non-reprogrammable ROM 242 may be programmed only by a manufacturer with metal masks and is incapable of being reprogrammed once chip 202 is implemented in a field of use, such as within a cell phone, a router, or a video game console. Control block 228 may include hardwired state machine (SM) 234.

Moreover, the external memory 206 may be a random access memory (RAM), such as a static RAM (SRAM) or a dynamic RAM (DRAM). The DRAM may be a double data rate DRAM (DDR DRAM). Also, the external memory 204 may be a Flash memory, which may be a parallel NOR Flash memory, a serial NOR Flash memory, or a NAND Flash memory.

Factory-provided compressed configuration images may be placed in non-reprogrammable ROM 242 before delivery of ROM 242 to a higher assembly, and ROM 242 may be configured to store the compressed configuration images permanently. In one embodiment, the ROM 242 may store only one compressed configuration image. Moreover, in some embodiments, ROM may store a software code, which is further described below, and the compressed configuration image.

It is noted that in some embodiments, the functionality of PGA 210 may be provided by an Application Specific Integrated Circuit (ASIC). Moreover, in various embodiments, the decompressor 244 may be a software program stored within ROM/decompressor subsystem 240. It is further noted that although one mode select pin is shown in FIG. 2, in some embodiments, more than one mode select pin may be used to receive a selection of a mode.

In some embodiments, instead of one external memory 204, multiple external memories on corresponding multiple chips may be used and instead of one external memory 206, multiple external memories on corresponding multiple chips may be used.

Figure 3A:
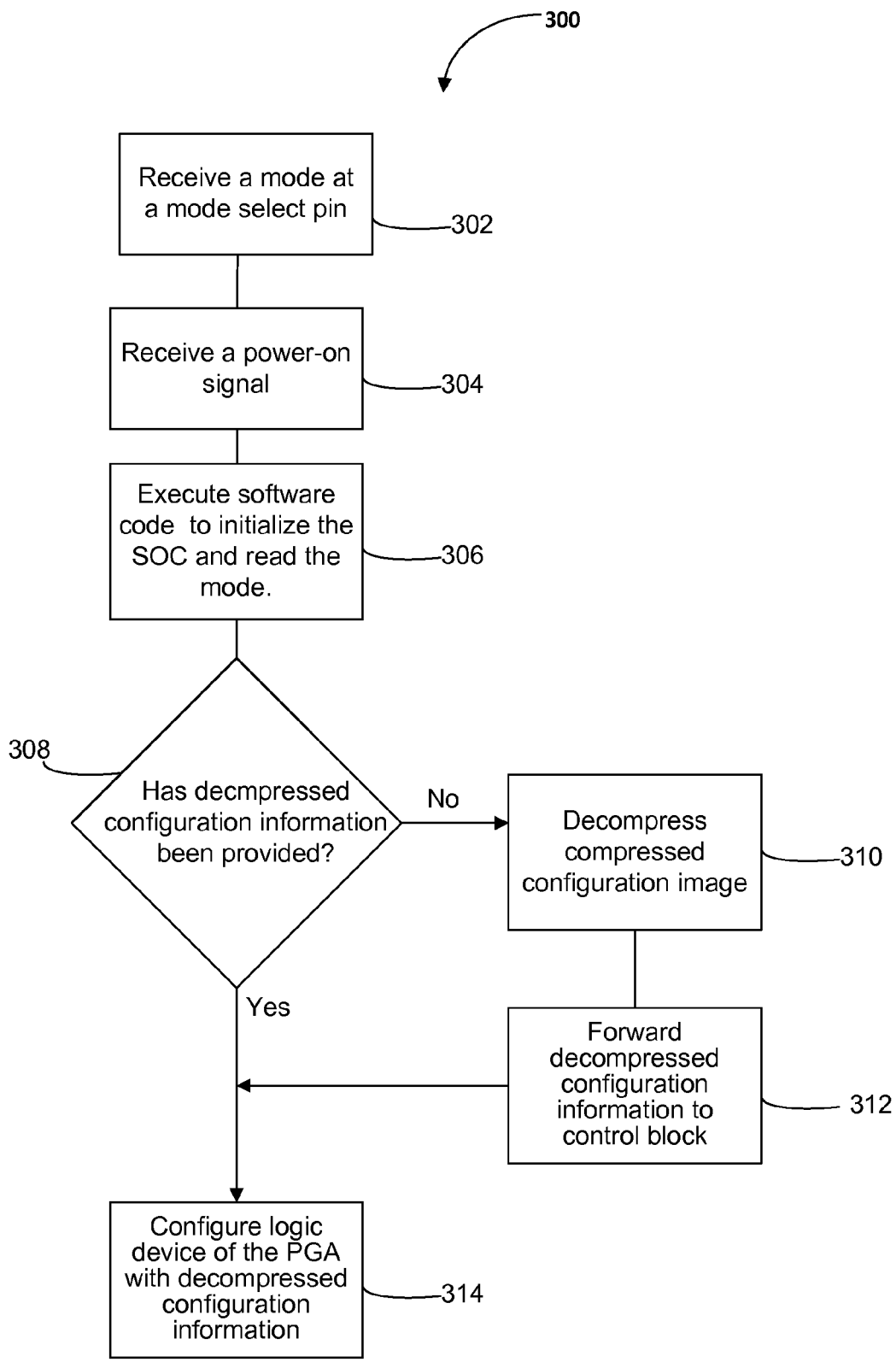
FIG. 3A is an exemplary flowchart of a method for configuring the LD in accordance with one embodiment of the present invention.
Figure 3B:
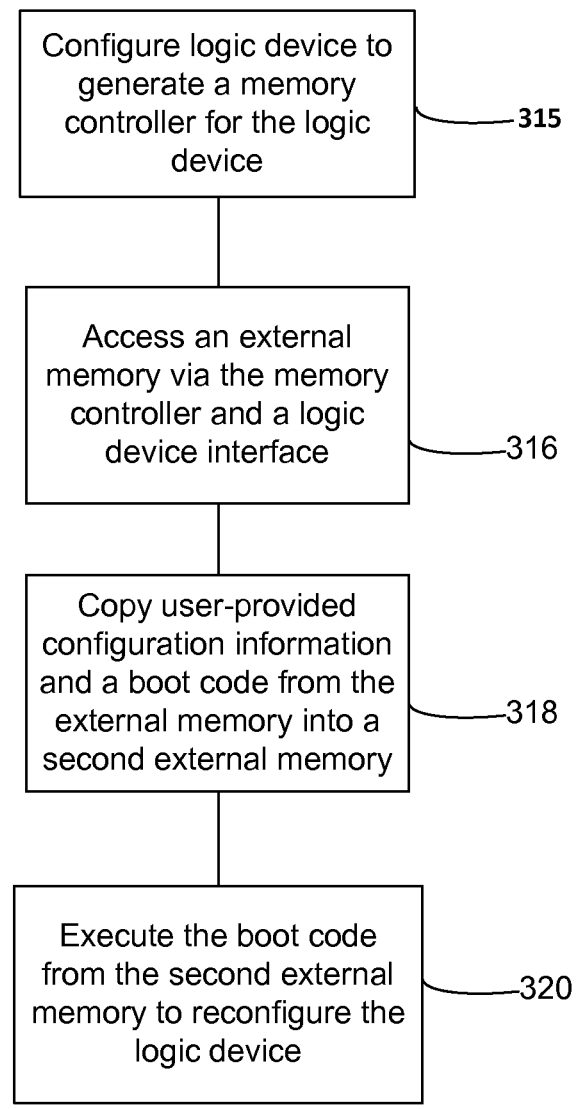
FIG. 3B is a continuation of the flowchart of FIG. 3A.

FIGS. 3A and 3B illustrate an example method 300 for configuring a logic device. More particularly, for example, the method may be operable to configure logic device 230 using a configuration image stored, in compressed form, in ROM 242, in accordance with one embodiment of the invention. According to method 300, at block 302 a selected mode is received at a mode select pin. For example, control block 228 may receive the mode via mode select pin 238. The mode may be received from a computer, for example. The mode may include a boot mode and/or a configuration mode. The boot mode may be communicated by boot mode interface 218 to processor 212 to indicate that boot of SOC 208 is to be based on a boot code stored in external memory 204. The boot code may be sometimes referred to herein as a bootstrap code. Moreover, the configuration mode may indicate to control block 228 that logic device 230 is to be configured with user-provided configuration information stored in external memory 204. The configuration mode may also indicate to the CB 228 that the logic device 230 is to be configured with the user-provided configuration information after the LD 230 is configured with a decompressed configuration image, as described below. Based on the configuration mode, control block 228 may be caused to avoid using uncompressed configuration information from an external memory (e.g., a flash memory chip) and may instead be caused to use configuration information based on a compressed configuration image stored in ROM 242.

At block 304, a power signal may be received to power on a PGA and/or a SOC. For example, PGA 210 and SOC 208 may receive a power on signal. In response to receiving the power on signal, PGA 210 and SOC 208 may be powered on exit from power-on reset mode.

At block 306, software code may be executed to initialize the SOC and read the mode. For example, in response to being powered on, processor 212 may execute software code stored, in ROM 242. Processor 212 may execute the software code to initialize SOC 208 and read the mode. In addition, or in the alternative, hardwired state machine 234 may read the mode.

At block 308, a determination may be made whether decompressed configuration information has been provided. If not, control block 228, for example may wait for SOC 208 to provide control block 228 with the decompressed configuration information.

At block 310, a compressed configuration image may be decompressed if it is determined that the decompressed configuration information has not been provided. For example, while control block 228 waits, decompressor 244 may perform an operation of decompressing the compressed configuration image to generate the decompressed configuration information and to send the decompressed configuration information to control block interface 220. It is noted that in some embodiments in which decompressor 244 is the software program, processor 212 may execute the software program to decompress the compressed configuration image, generate the decompressed configuration information, and send the decompressed configuration information to the control block interface 220. Decompressor 244 may apply decompression software, such as gzip or bzip2. In some embodiments decompressor 244 may be implemented as a hardwired state machine.

At block 312, decompressed configuration information may be forwarded. For example the decompressed configuration information may be forwarded to control block interface 220. Control block interface 220 may receive and buffer the decompressed configuration information, and forward the decompressed configuration information to control block 228.

At block 314, a logic device may be configured with the decompressed configuration information. For example, control block 228 may receive the decompressed configuration information and may configure the logic device 230 with the decompressed configuration.

In some embodiments, the method is completed at block 314.

In other embodiments, however, referring now to FIG. 3B, the logic device may be further configured, at block 315, to generate an interface controller of the logic device. For example interface controller 232 may be generated.

At block 316, an external memory may be accessed via interface controller 232 and logic device interface 224. For example, PGA 210 may enter a user mode and processor 212 may perform an operation of accessing external memory 204 via interface controller 232 and logic device interface 224.

At block 318 user-provided configuration information and a boot code from the external memory may be copied into another external memory. For example, processor 212 may copy the user-provided configuration information and the boot code from external memory 204 into external memory 206. Processor 212 may perform the copying via interface controller 232, LD interface 224, interconnect 216, and external memory controller 226. The user-provided configuration information and the boot code may be buffered in logic device interface 224.

At block 320, boot code from the other external memory may be executed to reconfigure the logic device. For example, processor 212 may execute the boot code from external memory 206. The boot code may be executed to reconfigure the FPGA with the user-provided configuration information. For example, the boot code may be executed to send the user-provided configuration information from external memory 206 via external memory controller 226, interconnect 216, control block interface 220, and control block 228 to reconfigure logic device 230 with the user-provided configuration information. The user-provided configuration information may be the same or different than the decompressed configuration information. For example, both the decompressed configuration information and the user-provided configuration information may be used to generate interface controller 232 as a parallel NOR Flash memory controller.

By storing compressed configuration image in ROM 242 the costs and power consumption associated with the use of a flash memory chip (which is likely to be more expensive than ROM 242 may be avoided. Importantly, ROM 242 arranged to be non-reprogrammable, thereby protecting the integrity of a factory-provided configuration image, for example.

Figure 4:
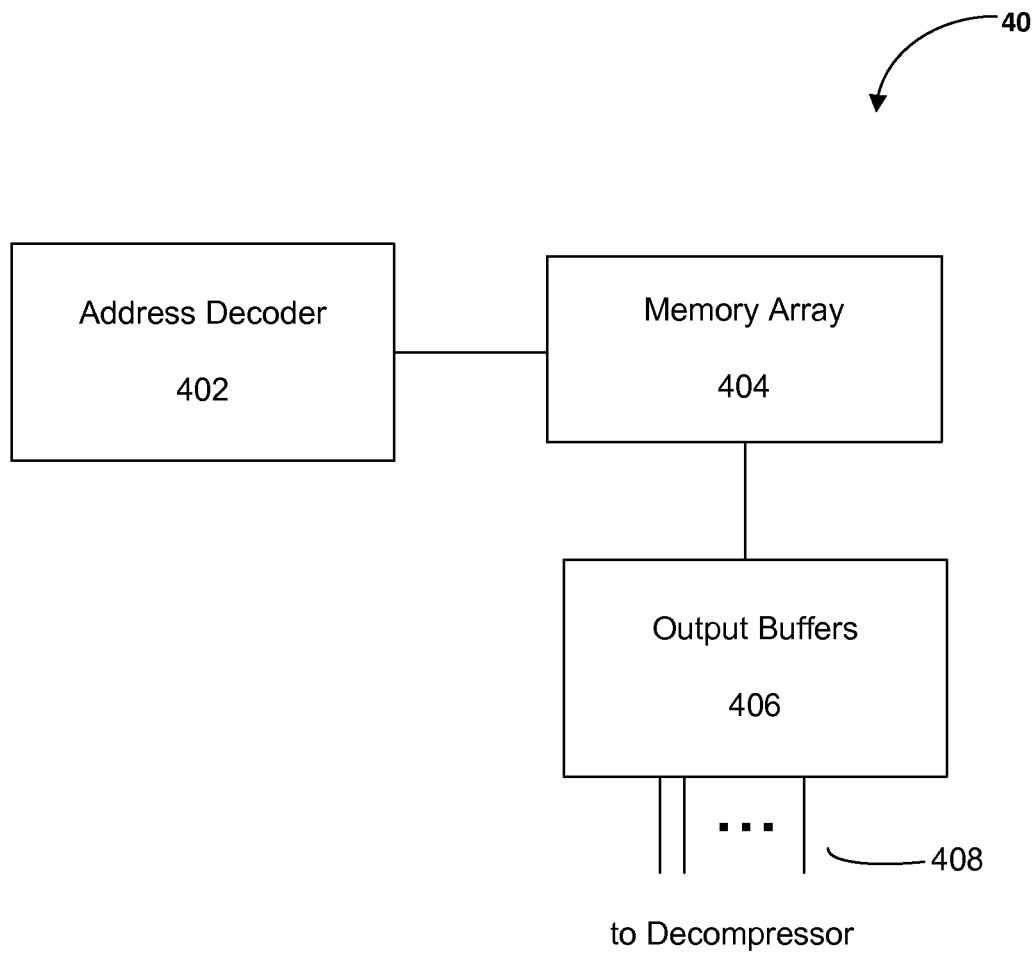
FIG. 4 is an exemplary block diagram of a read-only memory (ROM) used to store configuration information in accordance with one embodiment of the present invention.

Referring now to FIG. 4, a ROM 400 is described. The ROM 400 may include an address decoder 402, a memory array 404, multiple output buffers 406, and multiple output pins 408. The memory array 404 may include multiple memory cells. It is noted that at least some of the memory cells, advantageously, may include a metal mask fabricated by the manufacturer. The memory cells, whether or not masked, may store the compressed configuration image.

Decompressor 244 may request the compressed configuration image from the memory cells by sending, to address decoder 402 addresses of the memory cells in which the compressed configuration information is stored. Address decoder 402 may decode the addresses and the output buffers 406 may buffer the compressed configuration image received from the memory cells to provide the compressed configuration image via output pins 408 to the decompressor 244.

It is noted that in some embodiments, uncompressed configuration information may be stored in ROM 400 instead of the compressed configuration image. In this embodiment, SOC 208 may omit decompressor 244, and the uncompressed configuration information may be accessed by control block 228 from ROM 400 via control block interface 220 to configure the logic device 230 and generate interface controller 232.

Although the foregoing systems and methods have been described in detail by way of illustration and example for purposes of clarity and understanding, it will be recognized that the above described systems and methods may be embodied in numerous other variations and embodiments without departing from the spirit or essential characteristics of the systems and methods. Certain changes and modifications may be practiced, and it is understood that the systems and methods are not to be limited by the foregoing details, but rather is to be defined by the scope of the appended claims.

What is claimed is:

1. A chip comprising:
  a logic device;
  a control block;
  one or more mode select pins; and
  a read only memory (ROM) storing a plurality of configuration images for the logic device, wherein
    the ROM is non-reprogrammable;
    at least one mode select pin of the one or more mode select pins is arranged to receive a selected mode, the selected mode being one or both of a boot mode and a configuration mode, and to cause the control block to select at least one configuration image from the plurality of configuration images stored in said ROM;
    the at least one configuration image is used to configure the logic device; and
    in the configuration mode, the control block is caused to avoid using uncompressed configuration information from a flash memory and is caused to use configuration information based on a compressed configuration image stored in the ROM.

2. The chip of claim 1, wherein the ROM comprises a mask ROM.

3. The chip of claim 1, wherein the logic device comprises at least one of a programmable logic device and a field programmable gate array.

4. The chip of claim 1, wherein said at least one configuration image is in compressed form.

5. The chip of claim 1, wherein the at least one configuration image is compressed.

6. The chip of claim 5, wherein the configuration image is compressed by a factor of at least 50.

7. The chip of claim 6, wherein the decompressor comprises a hardwired state machine.

8. The chip of claim 1 further comprising:
  a decompressor adapted to decompress one or more compressed configuration images stored within said ROM to generate decompressed configuration information; wherein the decompressed configuration information is used to configure the logic device with the decompressed configuration information.

9. The chip of claim 8, wherein said at least one configuration image is in compressed form, and wherein the decompressor is adapted to decompress said at least one configuration image using a decompression software.

10. The chip of claim 9, wherein the decompression software is selected from the list consisting of gzip and bzip2.

11. The chip of claim 1, wherein the logic device comprises at least one interface controller, and the at least one configuration image is used to configure the at least one interface controller.

12. The chip of claim 11, wherein the interface controller comprises at least one of a memory interface controller and a communications interface controller.

13. The chip of claim 11, further comprising a processor adapted to use the interface controller to copy user-provided configuration information and boot code from a first external memory to a second external memory, wherein the first and second external memories are located outside the chip.

14. The chip of claim 13, wherein the second external memory comprises a dynamic random access memory (DRAM).

15. The chip of claim 13, wherein the processor is adapted to access the boot code from the second external memory to execute the boot software.

16. The chip of claim 13, wherein the processor is adapted to reconfigure the logic device with the user-provided configuration information.

17. A method comprising:
storing, within a non-reprogrammable read only memory (ROM), a plurality of compressed configuration images for a logic device, wherein the non-reprogrammable ROM and the logic device are each located within a single chip, the chip including a control block and one or more mode select pins;
acquiring configuration information from a selected one of the plurality of compressed configuration images, wherein at least one mode select pin of the one or more mode select pins is arranged receive a selected mode, the selected mode being one or both of a boot mode and a configuration mode, and to cause the control block to select at least one configuration image from the plurality of configuration images stored in said ROM;
configuring the logic device with the acquired configuration information; and
in the configuration mode, the control block is caused to avoid using uncompressed configuration information from a flash memory and is caused to use configuration information based on a compressed configuration image stored in the ROM.

18. The method of claim 17, wherein the logic device comprises at least one of a programmable logic device and a field programmable gate array.

* * * * *